(12) United States Patent
Leckelt et al.

(10) Patent No.: US 10,201,117 B2
(45) Date of Patent: Feb. 5, 2019

(54) INTEGRATED HIGH DENSITY SERVER VAULT WITH HVAC UPS BACKUP

(71) Applicant: REVOLVER 26 INVESTMENT CORPORATION, Phoenix, AZ (US)

(72) Inventors: Lindsey Leckelt, Sherwood Park (CA); Ryan Vetsch, Fort Saskatchewan (CA); Benoit Boudreau, Sherwood Park (CA)

(73) Assignee: REVOLVER 26 INVESTMENT CORPORATION, Phoenix, AZ (US)

( * ) Notice: Subject to any disclaimer, the term of this patent is extended or adjusted under 35 U.S.C. 154(b) by 176 days.

(21) Appl. No.: 15/252,580

(22) Filed: Aug. 31, 2016

(65) Prior Publication Data
US 2017/0064876 A1 Mar. 2, 2017

Related U.S. Application Data

(60) Provisional application No. 62/213,605, filed on Sep. 2, 2015.

(51) Int. Cl.
*H05K 7/14* (2006.01)
*H05K 7/20* (2006.01)

(52) U.S. Cl.
CPC ....... *H05K 7/20836* (2013.01); *H05K 7/1492* (2013.01); *H05K 7/1497* (2013.01); *H05K 7/20736* (2013.01); *H05K 7/20754* (2013.01); *H05K 7/20818* (2013.01)

(58) Field of Classification Search
CPC ............ H05K 7/20836; H05K 7/1497; H05K 7/20818; H05K 7/1492; H05K 7/20736; H05K 7/20754
See application file for complete search history.

(56) References Cited

U.S. PATENT DOCUMENTS

| | | | |
|---|---|---|---|
| 2011/0307102 A1* | 12/2011 | Czamara | H05K 7/1497 700/277 |
| 2012/0134107 A1 | 5/2012 | Peng et al. | |
| 2014/0133092 A1 | 5/2014 | Leckelt et al. | |
| 2015/0060009 A1* | 3/2015 | Shelnutt | F28F 27/02 165/11.1 |

FOREIGN PATENT DOCUMENTS

DE    202013105308    1/2014

OTHER PUBLICATIONS

English machine translation of Abstract for DE202013105308.
International Search Report and Written Opinion for PCT/US2016/049570 dated Nov. 4, 2016.

* cited by examiner

*Primary Examiner* — Ana M Vazquez
(74) *Attorney, Agent, or Firm* — Hueschen and Sage (57) ABSTRACT

The present invention relates in general to an Integrated High Density Server Vault (or "HDSV") system containing the necessary mechanical and electrical infrastructure for the installation, operation and cooling of heat generating data processing equipment within a scalable manufactured environment which includes, but is not limited to, computing and electrical equipment. The disclosure relates in particular to the equipment application as it pertains to units adapted for rapid deployment of computing and electrical equipment.

11 Claims, 7 Drawing Sheets

FIG. 5

INTEGRATED HIGH DENSITY SERVER VAULT WITH HVAC UPS BACKUP

FIELD OF THE INVENTION

The present invention relates in general to packaged equipment containing the necessary mechanical and electrical infrastructure for the high density installation, operation and cooling of heat generating data processing equipment within a scalable manufactured environment which includes, but is not limited to, computing and electrical equipment. The disclosure relates in particular to the equipment application as it pertains to units adapted for rapid deployment of computing and electrical equipment.

BACKGROUND OF THE INVENTION

The deployment of equipment such as computers and other electrical devices requires appropriate infrastructure to support it. Such infrastructure can include, but is not limited to, physical "brick-and-mortar" buildings or other protective shells consisting of walls, floor and roof. Traditional "brick-and-mortar" buildings are built up by contractors on site or are retrofitted from existing warehouses. The traditional brick-and-mortar data center is generally time consuming and expensive to put together and does not lend easily to scaling flexibility. The protective shells that enclose and protect the server equipment may also contain multiple premanufactured HVAC systems sharing the same floor space as the computer equipment. Other brick-and-mortar buildings employ premanufactured HVAC equipment located outside on the ground surrounding the perimeter of building enclosure or installed on the roof of the building. This outdoor HVAC equipment is usually large in scale and expensive, taking up large amounts of additional land space and or adding building cost due to high roof loading requirements. Moreover, remote placement of HVAC equipment increases airflow (distance), decreasing efficiency and inherent costs.

Computer rooms and other building spaces intended for specialized uses often contain equipment that requires precise control and regulation of environmental conditions such as temperature, humidity and general air quality in order to ensure proper operation of equipment (such as, but not limited to, computers) installed in such spaces. Cooling requirements for these types of spaces are typically much greater and more stringent than most building spaces due to, for example, the need to dissipate heat generated by computer equipment operating in the equipment rooms. Humidity control requirements are typically stringent as well since excessive moisture in the air can cause operational and maintenance problems with computing and electrical equipment. Similarly, general air quality requirement such as removal of air-borne particulates is critical for proper operational life of computing and electrical equipment. Redundancy of cooling/climate regulation systems is often essential as well, due to the critical nature of the computing and electrical equipment that may be installed in these spaces. Sufficient redundancy and backup systems are often used in these spaces to ensure continuity of operation of critical equipment.

In recent years, the single largest application for such spaces is what are called computer data centers, which consist of numerous servers installed in spaces with HVAC cooling infrastructure to dissipate equipment generated heat, and to remove humidity and particulates. Computer data centers typically reside in brick-and-mortar buildings that have been purpose-built or renovated to accommodate computing equipment (usually in the form of rows of server racks) and associated electrical equipment. With the explosive growth in the world's computing capacity requirements, the growth of data centers around the world has been similarly explosive.

A drawback of built-up infrastructure as discussed above is that the time for deployment of the required equipment is very long. In today's rapidly expanding computing world, this can often cause bottlenecks in the ability of a company to roll out additional computing capacity. The extended traditional deployment time also requires long-term forecasting which is not always possible. In the dynamic computing industry, there is often a need for rapid responses to changing market demands. With the extended deployment time, this option is often not available.

The costs associated with building up this type of infrastructure are also considerable, particularly with regard to costs associated with construction of a building or shell, electrical infrastructure, and HVAC systems on site.

Moreover, traditional brick-and-mortar data centers suffer from inefficiencies in terms of environmental control. Brick-and-mortar data centers are typically large scale warehouse type facilities defining a building envelope which is not completely controlled for conditioned air leakage, thereby diminishing efficiency. In addition, due to the scale of such brick-and-mortar facilities, there is less opportunity for precision climate control, all the while allowing for infiltration of unconditioned air and thus allowing unwanted particulates into the white space.

Brick-and-mortar facilities also suffer from their scale. In terms of air conditioning efficiency, the ability to control climate over a large floor area, which may have server racks and servers located over fifty feet from the cooling source, is a limitation inherent in brick-and-mortar facilities. This inherent inefficiency may result in selected servers being effectively and ineffectively conditioned depending on their widely distributed location over the extended floor area of the facility. It is typical that servers may be disposed in rows of racks extending more than forty server racks deep and typically as many as sixty server racks deep. The feasibility of distributing conditioned air over rows of server racks extending forty to sixty racks deep is a well-known limitation of brick-and-mortar facilities.

In recent years, in an industry attempt to move away from the traditional deployment of brick-and-mortar data centers, various companies have designed and deployed pre-manufactured modular data centers to try to mitigate some of the problems associated with traditional builds. Modular data centers are typically made in the form of packaged equipment, with most of the assembly being constructed in a factory as opposed to being built up on site. Such modular data centers can be suitable for either indoor or outdoor environments, with most being configured for indoor use. Some modular data centers can be installed on a vacant lot serviced with power, such that a building is not required for the site.

The purpose of the modular data center is to provide the required physical protection of computer and electrical equipment along with mechanical infrastructure required for the rapid deployment of computing capacity. A typical modular data center has a pre-built casing/enclosure comprised of separate modules. For ease of shipping and installation, such modules are typically sized in a ten by forty foot form factor. These modular data centers are separated into sections for servers as well as separate sections for cooling. The cooling infrastructure in modular data centers is separated from computing and electrical equipment in separate modular sections often installed above the computer and electrical equipment modules. Representative of such top-down modular data centers is that of CZAMARA, et al. (U.S. Pat. No. 9,101,080) which describes the typical arrangement of modular data centers with air handling capacity positioned over computing capacity and incorporating external condensing operations for refrigerant generation and regeneration. This type of separated deployment of refrigerant generation adds complexity, cost and time, as well as requires a larger profile on site. Moreover, this type of on-site stacking of cooling infrastructure and computing and electrical storage modules requires additional labor-intensive scope with respect to mechanical interconnections between stacked modules. This on site connection and assembly introduces uncontrolled quality penalties.

With respect to typical modular data center ten by forty foot form factors, certain limitations are introduced. Rows of server racks are typically disposed longitudinally along the length of the standard form factor. Longitudinal disposition of rows of server racks provides utility in terms of access to servers and delineation of hot and cold or conditioned and exhaust aisles. Dimensional constraints limit the installation to twenty racks or fewer per form factor. Cooling infrastructure is typically attached to or stacked on these server rack modules in separate modules which do not share service access with the server rack modules.

Most modular data centers currently on the market are narrow in scope, and are built for temporary use as a stopgap until a brick-and-mortar installation is ready for use. They are often built from a "server container" standpoint, with insufficient attention paid to integrating HVAC and computing infrastructure. This "server-in-a-box" approach limits the utility and versatility of modular data centers as well as their viability as permanent replacements for brick-and-mortar data centers. Inefficiencies are introduced into the system through inferior equipment casing construction, as well as sub-optimal integration of separately sourced components.

For the foregoing reasons, there is a need for manufactured server facilities that can act as a direct drop-in replacement for conventional brick-and-mortar buildings while improving upon the construction methods, scalability and system configurations found in modular data centers currently on the market.

SUMMARY OF THE INVENTION

The present invention relates to an integrated high density server vault (HDSV) system comprising one or more server modules adapted for receiving one or more rows of server racks(s) and providing electrical and communication connectivity for disposed computing and electrical equipment, wherein each server module is operationally associated with an integrated mechanical module comprising: a fully self-contained heating, ventilation and air conditioning (HVAC) system adapted for maintaining precise temperature and humidity levels and otherwise directly ventilating the server module with which it communicates with respect to air flow, wherein the HVAC system is optionally equipped with an uninterrupted power system (UPS); and an automatic fire suppression system adapted for protecting the contents of the server module; wherein the integrated server and mechanical modules are adapted to be operationally connected to each other forming a unitary integrated high density server vault system which functions to maintain set temperature and humidity, air quality and otherwise protect computing and/or electrical equipment installed in the server rack(s), and providing for operational functioning of and between the installed computing and/or electrical equipment, wherein the connection between the server and mechanical modules is adapted to provide practical access to the server and mechanical modules through a common white space.

A further aspect of the integrated HDSV system is that it is sized such that individual server module(s) and individual mechanical modules(s) may be delivered via conventional trucking means on roadways.

A further aspect of the integrated HDSV is that it is adapted for physical, electrical, data, communications and/or air quality connectivity with one or more additional integrated HDSVs such that the two or more integrated HDSVs cooperate in maintaining set temperature and humidity and otherwise protecting equipment installed in a plurality of server racks, and/or such that the disposed computing and/or electrical equipment operationally communicate.

A further aspect of the integrated HDSV system is that it is adapted to be weather proof.

A further aspect of the integrated HDSV system is that it is adapted to provide an airtight enclosure.

A further aspect of the integrated HDSV system is that it is adapted to provide an enclosure insulated against temperature fluctuations.

A further aspect of the integrated HDSV system is that the server module is lined with a material providing an impervious surface.

A further aspect of the integrated HDSV system is that the HVAC system comprised in the mechanical module is a self-contained system selected from the group consisting of direct expansion (DX) refrigeration, direct evaporative cooling, indirect evaporative cooling, heat pipe cooling, and heating by means of electric heat or heat pump.

A further aspect of the integrated HDSV system is that the configuration of the server module and the mechanical module is adapted to provide for a positive air flow of HVAC processed air and wherein openings exist between the mechanical module and the server module creating, in association with the rows of server racks and HDSV exterior walls, zones of HVAC processed air flow from the HVAC units through server racks and into return zones, wherein return air is directed upwards and back to the HVAC system.

A further aspect of the integrated HDSV system is that the configuration of the server module is such that four to six rows of six or less server racks may be disposed perpendicular to the longitudinal wall of the server module.

A further aspect of the integrated HDSV system is that it further comprises partial bulkhead partitions positioned above the rows of server racks on the processed air face of the rows of server racks, further defining the return air zone as comprising the rows of server racks.

DETAILED DESCRIPTION OF THE INVENTION

In general terms, an Integrated High Density Server Vault (or "HDSV") system utilizing methods of construction and system design that allow the HDSV unit to serve as a drop-in replacement for a traditional brick-and-mortar server storage room, while also providing cost effective functional and operational improvements and advantages including scalability over other modular data centers currently on the market. Explicit in these embodiments is the facility to be fully modularized, pre-fabricated and movable. It is contemplated that such constituent modules may be moved as fully integrated units or constituent units from, for example, a place of pre-fabrication to an operational site, or from one operational site to another operational site. Modules may be moved by forms of shipping common in the industry, such as flatbed trailers and the like.

As used herein, heating, ventilation and cooling (HVAC) system means a system which provides processed air to one or more computing and/or electrical components operationally associated with the instant HDSV.

As used herein, server module includes any facility or portion of a facility in which computing and electrical equipment is deployed. Examples of computing and electrical operations include information processing, communications, simulations and operational control.

As used herein, module is a constituent component or combination of components which may be operationally associated with each other. In the instant description, modules may be described by their functional and/or physical distinction and/or separate assembly. Modules may comprise integral components selected from the group consisting of air handling units, air processing units, fire suppression units, uninterrupted power units, as well as structural elements such as frames, housings, walls, ceilings, floors, doors and the like.

Figure 1A:
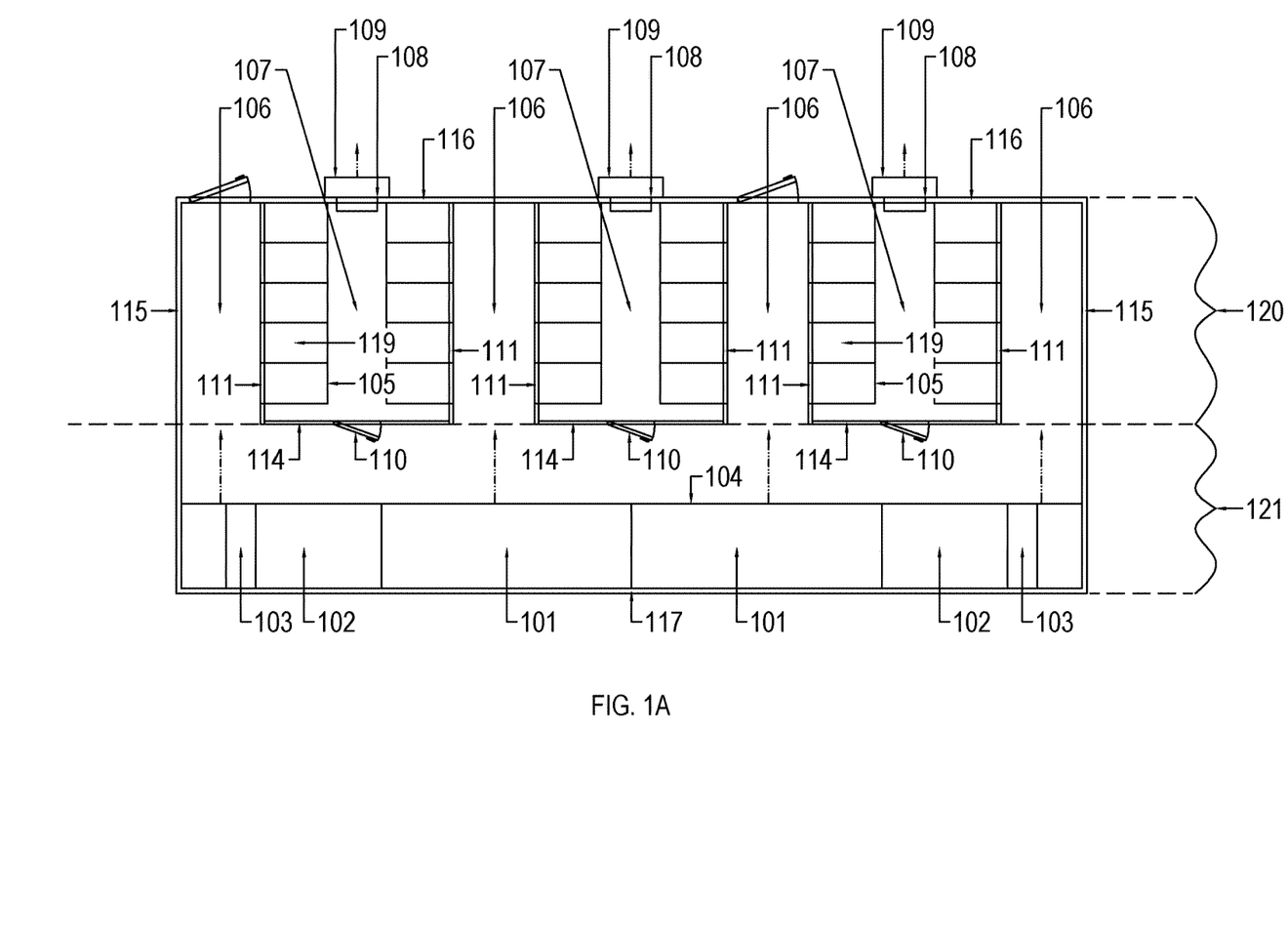
FIGS. 1A-1C show a sectioned plan view in combined and expanded views of one embodiment of the HDSV system. Critical equipment (e.g., rows of server racks), fire suppression equipment, module layout, and HVAC system are all illustrated as disposed on one level or laterally.
Figure 1B:
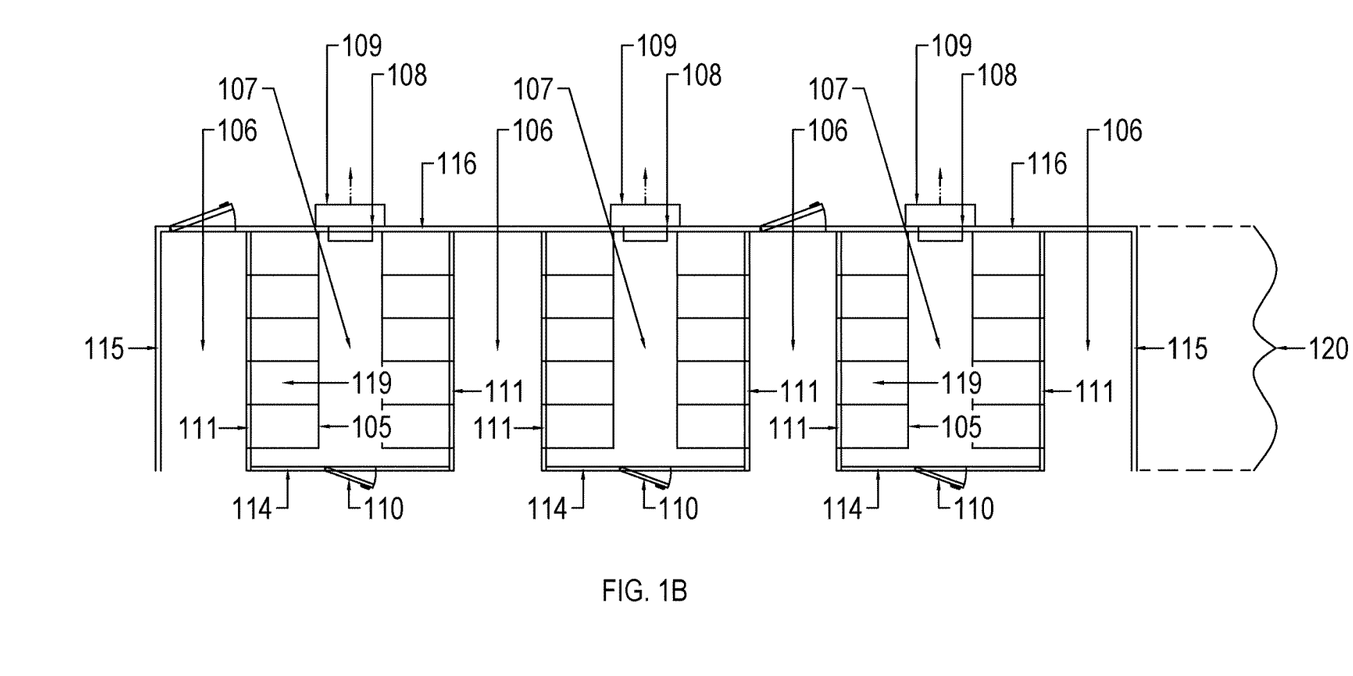
Figure 1C:
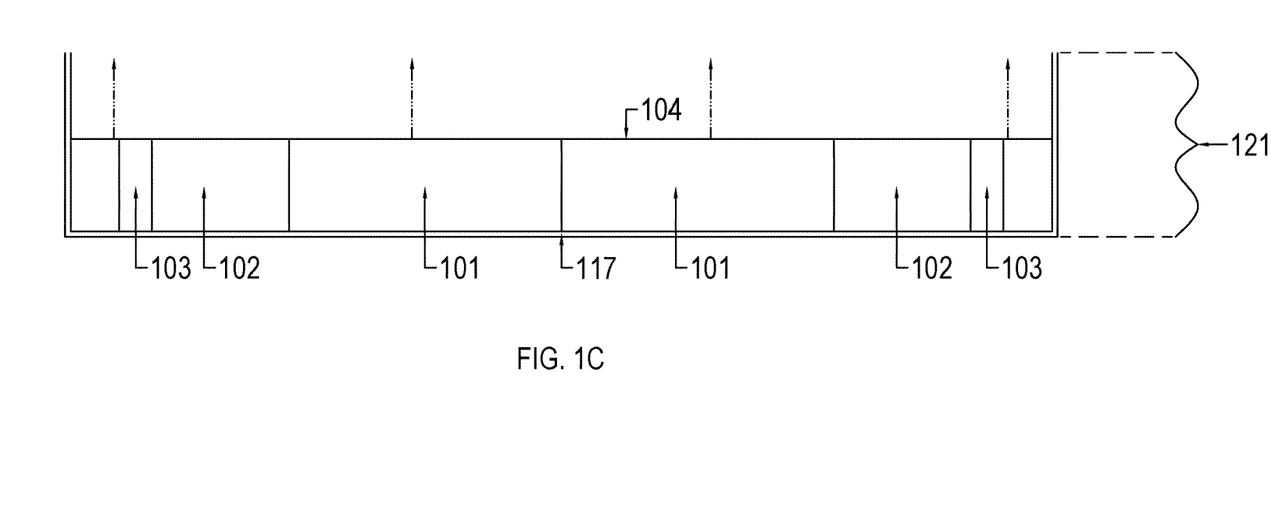

Exemplary embodiments of HDSV units in accordance with the present invention are illustrated in the accompanying Figures as summarized below:

FIGS. 1A-1C show a sectioned plan view in combined and expanded views of one embodiment of the HDSV system. Critical equipment (e.g., rows of server racks), fire suppression equipment, module layout, and HVAC system are all illustrated as disposed on one level or laterally.

Figure 2:
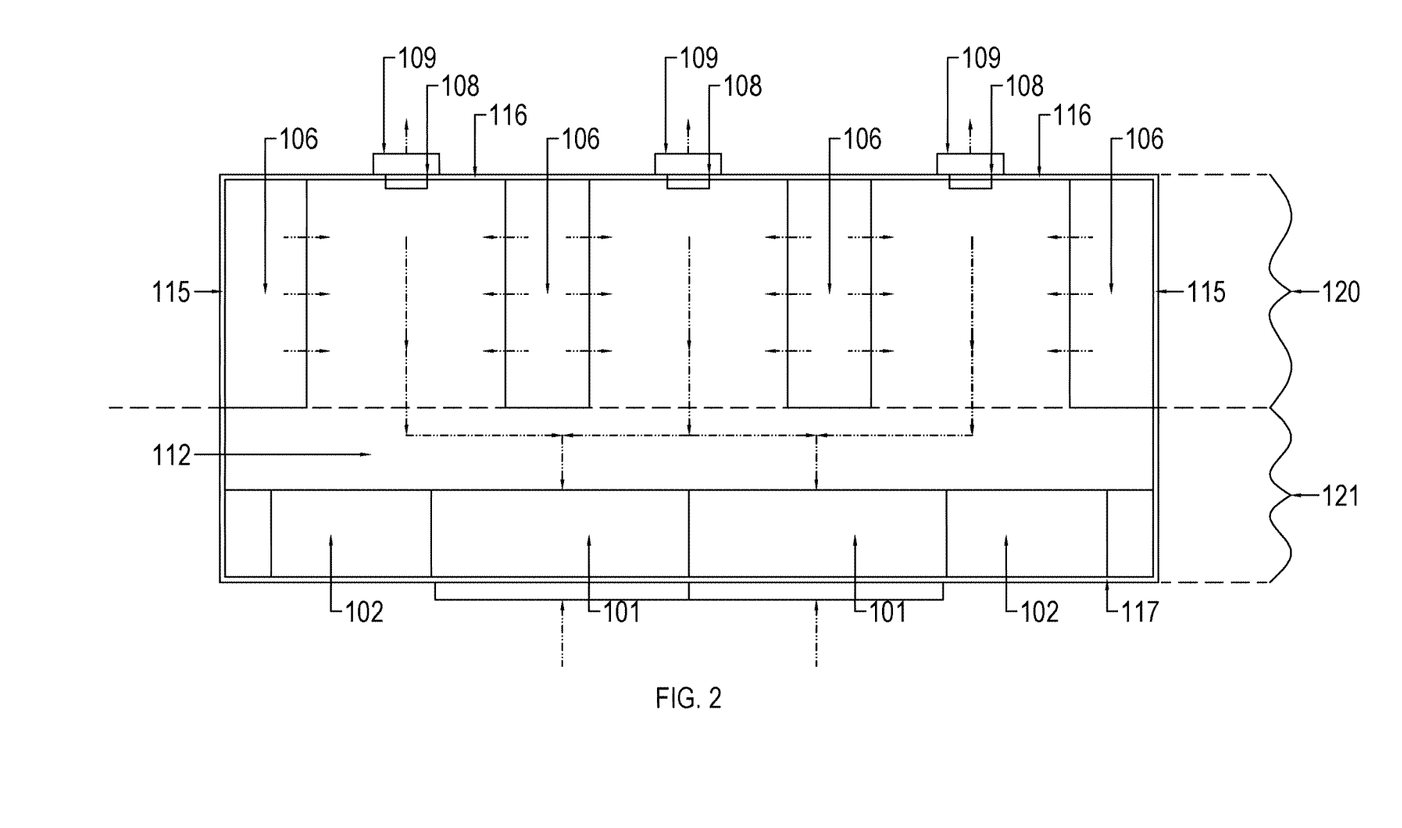
FIG. 2 is a sectioned plan view of one embodiment of the HDSV system showing the ceiling level of the HDSV system, again showing the various components disposed on one level.

FIG. 2 is a sectioned plan view of one embodiment of the HDSV system showing the ceiling level of the HDSV system, again showing the various components disposed on one level.

Figure 3:
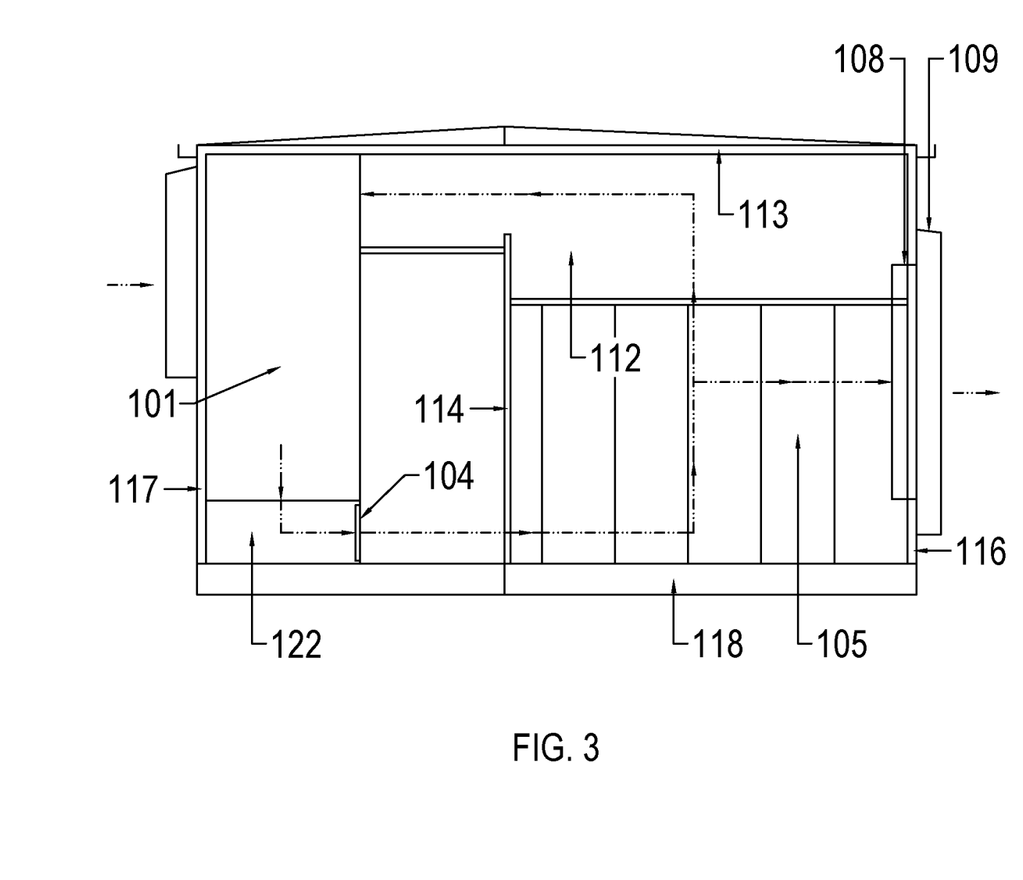
FIG. 3 is a sectioned view showing one possible layout of a typical HDSV module installation with the different airflow patterns and the critical equipment (e.g., rows of server racks), module layout, and HVAC system are all illustrated.

FIG. 3 is a sectioned view showing one possible layout of a typical HDSV module installation with the different airflow patterns and the critical equipment (e.g., computer rows of server racks), module layout, and HVAC system are all illustrated.

Figure 4:
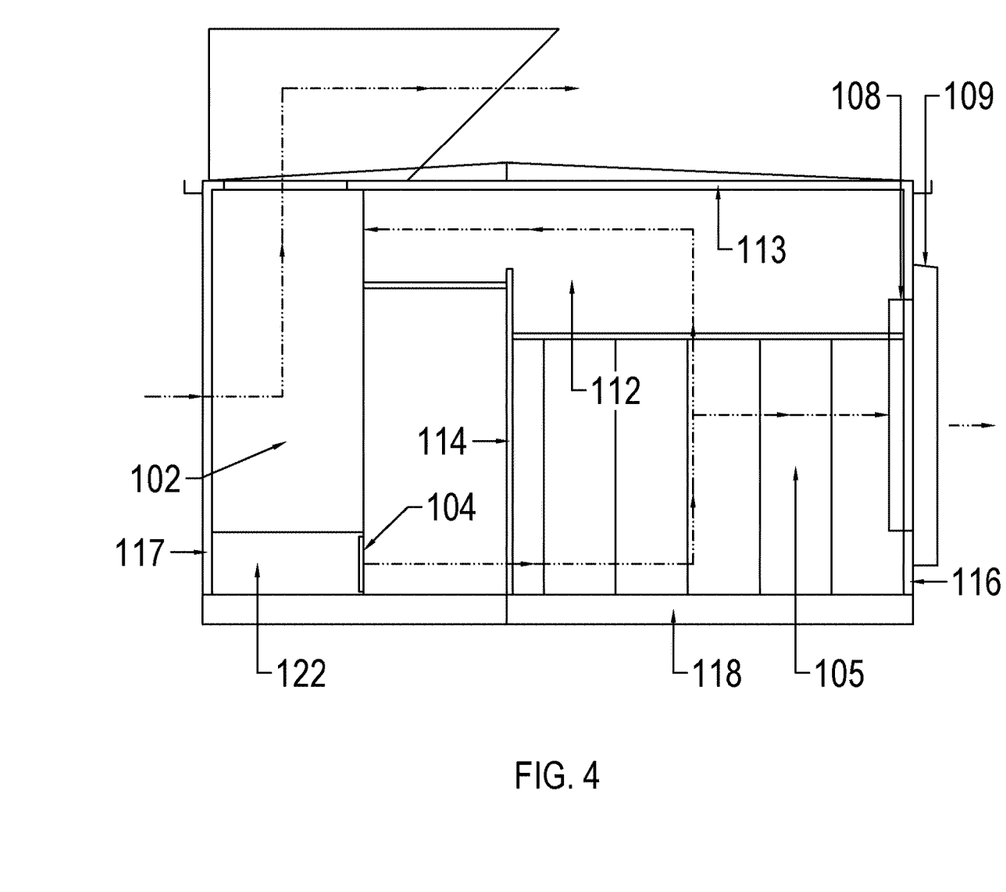
FIG. 4 is a sectioned view showing one possible layout of a typical HDSV module installation with the different airflow patterns and the critical equipment (e.g., rows of server racks), module layout, and HVAC system are all illustrated.

FIG. 4 is a sectioned view showing one possible layout of a typical HDSV module installation with the different airflow patterns and the critical equipment (e.g., computer rows of server racks), module layout, and HVAC system are all illustrated.

Figure 5:
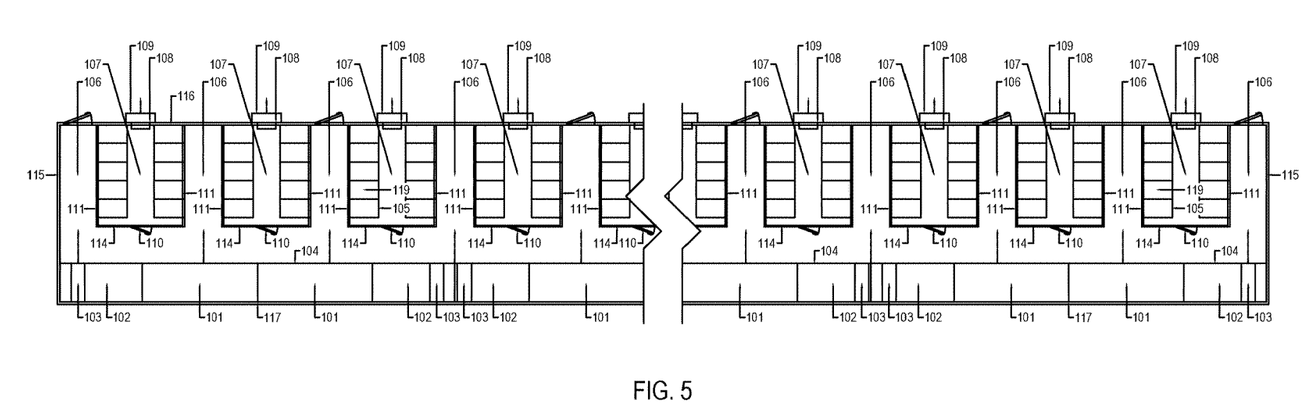
FIG. 5 is a sectioned plan view illustrating the scalability of the HDSV system.

FIG. 5 is a sectioned plan view illustrating the scalability of the HDSV system.

The HDSV depicted in FIG. 1 A-C, FIG. 2, FIG. 3, and FIG. 4 comprises a server module adapted for receiving one or more rows of server rack(s), wherein the server module is operationally associated with an integrated mechanical module comprising a fully self-contained heating, ventilation and air conditioning (HVAC) system adapted for maintaining set temperature, humidity levels and air quality standards and otherwise directly ventilating the server module with which it communicates with respect to air flow, wherein the HVAC system is optionally equipped with an uninterrupted power system (UPS), and an automatic fire suppression system adapted for protecting the contents of the server module. In describing self-contained HVAC systems, it is advantageously contemplated that all constituents for generating heating and/or cooling capacity, depending on the application of the HDSV, are contained within the confines of the module. The server module and integrated mechanical space are adapted to be operationally connected to each other, optionally in a side-by-side fashion, forming a unitary integrated high density server vault (HDSV) which functions to maintain set temperature, humidity and air quality standards, to otherwise protect equipment installed in the server rack(s), and to provide practical access to server and mechanical modules through a common white space. The HDSV is optionally insulated against temperature, environmental and other conditions which would compromise the normal operation of computing and electrical equipment. The HDSV system may be described as depicted in FIG. 1A, showing a mechanical module 121 operationally attached and connected to a server module 120. The two sections which may be disposed side-by-side in the embodiment are as follows:

Server Module: contains the necessary supporting infrastructure to operate computing and electrical equipment. As shown in FIG. 1B, the Server Module 120 is structured to provide for up to six rows of server racks 105, each row of server racks 105 comprising up to six server racks 119, the rows of server racks 105 being disposed perpendicular to the longitudinal exterior wall 116. The Server Module is structured to create segregated HVAC processed air zones 106 and return air zones 107 to assist with effective operation of the server and/or electrical equipment. Air flow path is from the mechanical module into a HVAC processed air zone 106 formed between two rows of server racks 105 and/or a row of server racks 105 and a terminal wall 115, through the rows of server rack(s) and into a return zone 107 defined by two rows of server racks 105 and/or a terminal wall 115, a partition wall 114 separating the return zone from the mechanical module, optionally comprising a doorway 110, the return zone 107 further comprising partial bulkhead partitions 111 running longitudinally along the top-side of the processed air side of the rows of server racks 105. Return air is either exhausted to the outside through a damper 108, security and louver assembly 109 or recirculated through a plenum 112 running from the return air zone along the ceiling 113 and back into the HVAC system for processing and distribution back into the processed air zone as required (see FIG. 3). The server module comprises control sensors and control panels used in the HDSV to provide precise temperature, humidity and air quality control by the HVAC system in order to provide the required climate for computing and electrical equipment disposed within the server module. The server module is defined by a roof, a floor, a longitudinal exterior wall 116 distal from the mechanical module, and optionally one or two terminal walls 115 at either end of the server module. Walls of the server module may optionally be covered by impervious wall coverings typical in the computing and electrical industry spaces.

The server module is configured to include partial bulkhead partitions 111 separating the return zone from the processed air zone, thereby preventing mixing of the processed air with the return air. The partial bulkhead partitions run longitudinally along the processed air side of the top of the rows of server racks, thereby enclosing the server racks containing the computing and electrical equipment in the return air zone instead of the processed air zone. The location of the partial bulkhead partitions in association with positive processed air flow enables radiant heat from the computing and electrical equipment to be captured in the return air zone rather than dissipating into the processed air zone. The partial bulkhead partitions are located to promote efficient airflow, directing the processed air through the server racks instead of allowing dead space above the rows of server racks where mixing could occur. The return air zone created above the rows of server racks by placing the partial bulkhead partitions at the processed air side of the rows of server racks provides volume for the return air to expand allowing the return air to exit the server module with less pressure.

Mechanical module 121 as depicted in FIG. 1C contains HVAC systems 101, optional integrated condensing units 102 for refrigerant generation and/or regeneration, HVAC control systems and fire suppression systems 103. The HVAC system may comprise multiple Computer Room Air Conditioning (CRAC) units for at least N+1 redundancy to deliver processed air to control the air quality for computing and electrical equipment disposed in the server module 120. For energy savings the HVAC system can also utilize direct outside air or a combination of outdoor air mixed return zone air to control the air quality for the computing and electrical equipment, which air is provided through outside air openings perforating an exterior wall of the module and controlled through the use of dampers and louvers. Multiple CRAC units may be arranged to deliver processed air into a common air plenum 122 (see also FIG. 3) and processed air is discharged through a processed air plenum diffuser 104 so that the optional multiple CRAC units may provide processed air to the entire server module in an evenly distributed manner. The mechanical module 121 is defined by a ceiling 113, a floor 118, a longitudinal exterior wall 117 distal from the server module 120, and optionally one or two terminal walls 115 at either end of the mechanical module (see FIGS. 1A and 3).

The HDSV system is preferably delivered as a scalable piece of packaged equipment listed in accordance with ETL, UL, CSA, and/or other regulatory bodies as may be required by the local jurisdiction, thereby eliminating the need for mechanical and electrical inspection in some jurisdictions. Each HDSV is configured to minimize footprint. The HDSV may be scalable in size as shown in FIG. 5. One, two or more HDSV assemblies with both laterally dispersed server and mechanical modules may be assembled together with specialized HDSVs, comprising two longitudinal enclosing walls 116 & 117, one terminal wall 115, floor 118 and ceiling 113 (see also FIG. 3). Middle assemblies are comprised of two longitudinal walls 116 & 117 connecting with the longitudinal wall of an adjoining HDSV assembly. Further scalability of assemblies maintains a complete multiple assembly HVAC redundancy of N+1 through the common plenum 122 that is maintained when scaled (see also FIG. 3).

The HDSV system offers significant savings in lead time, capital costs, and initial cash outlay as compared to conventional data centers. The HDSV system is purposefully designed and arranged to allow for all sub-systems to be integrated in-factory, including but not limited to HVAC systems, refrigerant/heating generation, fire suppression systems, electrical and data distribution systems. All systems are designed and arranged in a way that allows for factory-level quality assurance measures as opposed to field-installed quality by third party contractors. The elimination of the brick-and-mortar building as well as the additional time spent installing built-up mechanical, electrical and physical elements provides for decreased time and costs and improved quality. In addition, the HDSV system is delivered as packaged equipment, thereby significantly reducing the time and cost of obtaining permits.

The HDSV assembly allows for sufficient redundancy to accommodate several different mechanical component failures. "N+1 redundancy" in the air processing system allows for the system to continue to operate at 100% design capacity notwithstanding the failure of any one single component system. In an embodiment, the HVAC system comprises two or more conventional purpose-built computer room air conditioning (CRAC) units per HDSV assembly, with each CRAC unit incorporating standalone programmable logic controllers (PLCs) that can interface through communication with multiple additional CRAC units and control panels in adjacent HDSV assemblies to provide a communal control system for added operational resiliency. These interfaces are optionally provided such that connections may be made through conventional couplings not requiring the services of sub-contracted electricians. In an embodiment, such coupling may be made by USB connections.

Each CRAC unit provides processed air to a common plenum which is used to optimize air distribution to the computing and electrical equipment throughout the entire HDSV and/or multiple HDSVs. The plenum is designed in such a way to allow for scaling for multiple HDSV assemblies operating together to form one large-scale system serving a scalable quantity of computing and electrical equipment. This inter-connectivity between HDSV assemblies is the novel solution to self-contained individual modules. The HDSV system offers greater scalability, greater reliability, and greater flexibility for various redundancy requirements which are all attributable to lower costs, easy deployment and integrated functioning of computing and electrical equipment.

Conventional Modular Data Centers (MDCs) are space constrained to comprise up to twenty server racks disposed longitudinally in a standard ten by forty foot form factor. With the HDSV system of the present invention, up to six rows of six server racks may be disposed in a typical HDSV server module, occupying the same form factor as typical MDCs. This configuration provides for more than a fifty percent increase in server racks over conventional MDC configurations. In one embodiment, up to six HDSVs may be scaled in a system and may be powered by a single 1.5 MW electrical power source. Thus, up to 210 server racks may be powered by a single 1.5 MW electrical power source. This is distinguished from typical industry configurations in which up to six MDCs comprising up to 120 server racks are powered by a 1 MW electrical power source. To provide the same level of server capacity as provided with the instant HDSV systems, MDC systems would require fifty percent more electrical power sources, significantly increasing build out costs.

In another aspect, an embodiment of the HDSV system provides for improved air conditioning efficiency over that of industry standard MDC configurations. For example, contrasting the configuration of CZAMARA, et al., U.S. Pat. No. 9,101,080, in which racks of ten servers are disposed longitudinally along the length of a server module and processed air flows downward and along the full longitudinal length of the server module, returning up and back over the same longitudinal length. It may be that in the CZAMARA MDC system servers disposed at different ends of the racks receive very different quality of air conditioning and the longer air path results in increased air system pressure drop resulting in increased energy consumption. In contrast, the instant HDSV system provides for significantly shorter air path and results in increased air conditioning and energy efficiency due to the lateral disposition of more server rows.

The heat-generating computing and/or electrical equipment disposed within the HDSV is arranged to allow for unidirectional airflow with segregated processed and return zones within the assembly. This greatly increases air processing efficiency of the HVAC system by preventing computing and electrical equipment heat from being re-circulated through the equipment. The design of the HDSV server module specifically accommodates this processed and return zone arrangement.

The HDSV system is controlled by a dedicated network of onboard PLCs which control all aspects of HDSV operation, including monitoring internal temperatures and humidity, modulating fan speed and operation of the processing systems. The control system incorporates at least N+1 redundancy to allow for a full control system backup. The HDSV control system provides sustainable temperature and humidity control in the server module.

Busways are disposed throughout the HDSVs and provided pre-packaged in-factory complete with tap-boxes and power monitoring apparatus to allow for easy "plug-and-play" of the computing and electrical equipment. Busways are optionally located in the return zone for ease of access.

Variants of the disclosed HDSV can be adapted in accordance with one or more options as listed below with respect to airflow configuration, air processing method, control type, computing and electrical equipment and scalability:

Location: HDSV's are fully configurable for either indoor or outdoor operation.

Air processing method: As described above, multiple air processing options exist. In addition, for low density systems or in cold climates, auxiliary heating systems are optionally provided to prevent excessively low temperatures within the HDSV assembly.

It will be readily appreciated by those skilled in the art that various modifications to embodiments in accordance with the present invention may be devised without departing from the scope and teaching of the present invention, including modifications which may use equivalent structures, systems, or materials hereafter conceived or developed. It is to be especially understood that the scope of the present invention is not intended to be limited to the described or illustrated embodiments, and that the substitution of a variant of a disclosed element or feature without any substantial resultant change in functionality will not constitute a departure from the scope of the invention. It is also to be appreciated that the different teachings of the embodiments described and discussed herein may be employed separately or in any suitable combination to produce desired results.

Wherever used in this document, terms such as "typical" and "typically" are to be interpreted in the sense of representative or common usage or practice, and are not to be misunderstood as limiting the scope of the claimed invention.

The present invention is not to be limited in scope by the specific embodiments described herein. Indeed, various modifications of the invention in addition to those described herein will become apparent to those skilled in the art from the foregoing description. Such modifications are intended to fall within the scope of the appended claims.

All patents, applications, publications, test methods, literature, and other materials cited herein are hereby incorporated by reference.

We claim:

1. An integrated high density server vault (HDSV) system comprising one or more server modules adapted for receiving one or more rows of server rack(s) and providing electrical and communication connectivity for disposed computing and electrical equipment, wherein each server module is operationally associated with an integrated mechanical module comprising:
    a) a fully self-contained heating, ventilation and air conditioning (HVAC) system adapted for maintaining precise temperature and humidity levels and directly ventilating the server module with which it the HVAC system communicates with respect to air flow; and
    b) an automatic fire suppression system adapted for protecting contents of the server module;
    wherein the server and mechanical modules are adapted to be operationally connected to each other forming a unitary integrated high density server vault system which functions to maintain set temperature and humidity, air quality and protect computing and/or electrical equipment installed in the server rack(s), and providing for operational functioning of and between the installed computing and/or electrical equipment,
    wherein the integrated HDSV system is adapted for physical, electrical, data, communications and/or air quality connectivity with one or more additional integrated HDSVs such that the two or more integrated HDSVs cooperate in maintaining set temperature and humidity and otherwise protecting equipment installed in a plurality of server racks, and/or such that the disposed computing and/or electrical equipment operationally communicate, and
    wherein the operational association between the server and mechanical modules is adapted to provide practical access to the server and mechanical modules through a common white space.

2. The integrated HDSV system of claim 1, sized such that individual server module(s) and individual mechanical modules(s) are constructed for delivery via conventional trucking on roadways.

3. The integrated HDSV system of claim 1, which is adapted to be weather proof.

4. The integrated HDSV system of claim 1, which is adapted to provide an airtight enclosure.

5. The integrated HDSV system of claim 1, which is adapted to provide an enclosure insulated against temperature fluctuations.

6. The integrated HDSV system of claim 1, in which the server module is lined with a material providing an impervious surface.

7. The integrated HDSV system of claim 1, wherein the HVAC system comprised in the mechanical module is a self-contained system selected from the group consisting of direct expansion (DX) refrigeration, direct evaporative cooling, indirect evaporative cooling, heat pipe cooling, and heating by means of electric heat or heat pump.

8. The integrated HDSV system of claim 1, wherein the operational association between the server module and the mechanical module is adapted to provide for a positive air flow of HVAC processed air and wherein openings exist between the mechanical module and the server module creating, in association with the rows of server racks and HDSV exterior walls, zones of HVAC processed air flow from the HVAC units through rows of server racks and into return zones, wherein return air is directed upwards and back to the HVAC system.

9. The integrated HDSV system of claim 8, further comprising partial bulkhead partitions positioned above the rows of server racks on the processed air face of the rows of server racks, further defining the return air zone as comprising the rows of server racks.

10. The integrated HDSV system of claim 1, wherein the server module is configured such that four to six rows of six or less server racks are disposed perpendicular to a longitudinal wall of the server module.

11. The integrated HDSV system of claim 1, wherein the HVAC system is equipped with an uninterrupted power system (UPS).

* * * * *

UNITED STATES PATENT AND TRADEMARK OFFICE
CERTIFICATE OF CORRECTION

PATENT NO. : 10,201,117 B2
APPLICATION NO. : 15/252580
DATED : February 5, 2019
INVENTOR(S) : Lindsey Leckelt, Ryan Vetsch and Benoit Boudreau Page 1 of 1

It is certified that error appears in the above-identified patent and that said Letters Patent is hereby corrected as shown below:

In the Claims

Column 10, Line 29, (Claim 1): "it" is to be deleted.

Signed and Sealed this
Twenty-sixth Day of March, 2019

Andrei Iancu
*Director of the United States Patent and Trademark Office*